US006806501B2

(12) United States Patent
Vanhaelemeersch et al.

(10) Patent No.: US 6,806,501 B2
(45) Date of Patent: Oct. 19, 2004

(54) INTEGRATED CIRCUIT HAVING SIC LAYER

(75) Inventors: Serge Vanhaelemeersch, Leuven (BE); Herman Meynen, Linden (BE); Philip D. Dembowski, Midland, MI (US)

(73) Assignee: Interuniverstair Microelektronica Centrum (BE)

( * ) Notice: Subject to any disclaimer, the term of this patent is extended or adjusted under 35 U.S.C. 154(b) by 0 days.

(21) Appl. No.: 10/359,403

(22) Filed: Feb. 5, 2003

(65) Prior Publication Data

US 2003/0143816 A1 Jul. 31, 2003

Related U.S. Application Data

(62) Division of application No. 09/980,769, filed as application No. PCT/BE00/00045 on Apr. 28, 2000, now Pat. No. 6,599,814.
(60) Provisional application No. 60/132,284, filed on May 3, 1999.

(51) Int. Cl.[7] .............................................. H01L 31/03
(52) U.S. Cl. ......................................... 257/77; 438/431

(56) References Cited

U.S. PATENT DOCUMENTS

| | | |
|---|---|---|
| 4,865,685 A | 9/1989 | Palmour |
| 4,948,461 A | 8/1990 | Chatterjee |
| 4,981,551 A | 1/1991 | Palmour |
| 5,436,174 A | 7/1995 | Baliga et al. |
| 5,571,374 A | 11/1996 | Thero et al. |
| 5,818,071 A * | 10/1998 | Loboda et al. .................. 257/77 |
| 6,255,211 B1 * | 7/2001 | Olsen et al. .................. 438/624 |
| 6,358,842 B1 * | 3/2002 | Zhou et al. .................. 438/633 |

FOREIGN PATENT DOCUMENTS

| | | |
|---|---|---|
| EP | 06314791 | 8/1994 |
| EP | 0725440 A3 | 8/1996 |
| EP | 0725440 A2 | 8/1996 |
| EP | 0845803 A1 | 6/1998 |

OTHER PUBLICATIONS

Ninomiya et al., "Chemical Etching of Thermally–Grown $SiO_2$ Films on SiC Studied by Spectroscopic Ellipsometry," Japanese Journal of Applied Physics, vol. 33, (1994), Apr., No. 4A, Part 1, Tokyo, JP.

Chappel et al., "High frequency CV characteristics of plasma oxidised silicon carbide," Electronics Letters, $2^{nd}$ Jan. 1997, vol. 33, No. 1.

Munch et al., Thermal Oxidation and Electroytic Etching of Silicon Carbide, Institut A fur Werkstoffkunde, Technische Universitat, Hannover, Germany.

Wolf et al., "Reactive Ion Etching of 6H–SiC in $SF_6/O_2$ with $N_2$ Additive for Device Fabrication," J. Electrochem So., vol. 143, No. 3, Mar. 1996.

\* cited by examiner

*Primary Examiner*—David Nelms
*Assistant Examiner*—Thao P. Le
(74) *Attorney, Agent, or Firm*—Jones Day

(57) ABSTRACT

The present invention is related to an integrated circuit having an SiC etch stop layer fabricated using a method for removal of silicon carbide layers and in particular amorphous SiC of a substrate comprising the steps of: converting at least partly said exposed part of said carbide-silicon layer into an oxide-silicon layer by exposing said carbide-silicon layer to an oxygen containing plasma; and removing said oxide-silicon layer from said substrate.

19 Claims, 3 Drawing Sheets

Step a)

Step b)

Step c) and d)

INTEGRATED CIRCUIT HAVING SIC LAYER

CROSS REFERENCES TO RELATED APPLICATIONS

The present application is a divisional of, and claims priority to U.S. Non-Provisional Ser. No. 09/980,769, filed on Feb. 19, 2002 now U.S. Pat. No. 6,599,814, and entitled "METHOD FOR REMOVAL OF SIC," currently pending, which is a U.S. national stage filing under 35 USC 371 and claims priority from PCT Application PCT/BE/00/00045, entitled "METHOD FOR REMOVAL OF SIC," filed on Apr. 28, 2000, which claims priority from U.S. Provisional Patent Application No. 60/132,284 also entitled "METHOD FOR REMOVAL OF SIC," filed on May 3, 1999. The above identified applications are incorporated by reference in their entirety.

BACKGROUND OF THE INVENTION

1. Field of the Invention

The present invention is related to an integrated circuit implementing a method for removal of silicon carbide layers and in particular amorphous SiC of a substrate.

2. Description of Related Art

SiC (Silicon Carbide), particularly amorphous SiC, is known as a chemically very stable component. In semiconductor processing, many modules, defined as a set of subsequent basic steps, require the presence of a thin layer which remains substantially unaffected by the operation being performed, i.e. so-called semi-inert layers. Particularly, such a semi-inert layer can be used as a hard mask layer during dry etch, or as an etch stop layer during wet/dry etch, or as stopping layer for a Chemical-Mechanical polishing process (CMP) or for many other applications. For instance, these semi-inert layers can also be used as diffusion barrier layers. Due to it's high chemical stability, the use of a SiC layer as a semi-inert layer may have benefits over other materials such as silicon dioxide and silicon nitride, especially for those applications where selectivity to the operation being performed is of high importance for successful implementation. In addition, SiC layers may be superior in terms of barrier properties. Document U.S. Pat. No. 5,818,071, which is incorporated by reference in its entirety, is related to interconnect structures incorporating a silicon carbide layer as a diffusion barrier layer particularly between a dielectric and a highly conductive metal layer with a resistivity less than about 2.5 microhm-centimetres. Document U.S. Pat. No. 5,818,071, which is incorporated by reference in its entirety, does not disclose the use of a silicon carbide layer as an etch stop layer and a diffusion barrier layer in pre-metal dielectric structures, particularly between a silicide layer and a dielectric. U.S. Pat. No. 5,818,071, which is incorporated by reference in its entirety, does not disclose how to pattern or to remove the silicon carbide layer selectively to the underlying layer, in casu a metal layer.

Although a silicon carbide layer is a very attractive layer to use in semiconductor processing and particularly in interconnect structures and dielectric structures, its high chemical stability can also be its biggest disadvantage. SiC suffers from the fact that it is very difficult (if not impossible at all) to remove and particularly to remove it selectively. Some examples of process flows where such removal is required are: the stopping layers in the CMP operations for definition of field area's using the shallow trench isolation approach; and the use as etch stop layers for contact and via definition, where the process flow requires the selective removal of the etch stop layer at the bottom of the contact/via to obtain low contact/via resistance. Another example is also related to the use of SiC as a stopping layer in CMP applications. The cleaning after CMP usually relies on under-etching of the particles/residues. This requires that the surface from which particles and/or residues need to be removed can be etched isotropically in a very controlled way. However, due to the high chemical stability of SiC, particles and/or residues on top of the SiC layer can not be under-etched and therefore, cleaning becomes rather difficult.

Document EP-A-0845803, which is incorporated by reference in its entirety, discloses the removal of a surface portion of a crystalline SiC film. First, defects are introduced in the top layer, thereafter, the top layer is converted into a silicon oxide layer by a thermal oxidation treatment typically at a temperature of 1100° C. This renders this process unsuited for use in interconnect structures and pre-metal dielectric (PMD) structures because active devices are already defined and therefore only limited thermal treatments can be applied, i.e. typically 600° C. or below. Moreover, the silicide layers in the PMD structures, are also not compatible with temperatures above 650° C., while most metal features in the interconnect structures are not compatible with temperatures typically above about 400° C.

Aims of the Invention

It is an aim of the invention to remove exposed layers of a SiC layer by converting at least a major part of said SiC layer in silicon (di) oxide or silicon oxide based layers. Particularly this conversion is performed at low temperatures, preferably 600 C. or below, in an oxygen-containing plasma. Thereafter the converted part of said SiC layer is removed.

It is a further aim of the invention to provide a method for fabricating an interconnect structures, including PMD structures, using SiC as etch stop layer and/or diffusion barrier layer by using the aforementioned method for in-situ selective removal of exposed layers of the SiC layer.

It is still a further aim of the invention to provide an interconnect structure, particularly a PMD structure wherein a SiC layer can be used as an etch stop layer between a conductive layer and the surrounding dielectric.

SUMMARY OF THE INVENTION

This invention is about the selective removal of exposed layers of SiC layers which allows the use of this highly chemically stable material for a wide range of applications. At least for the purpose of this disclosure a carbide-silicon layer is an insulating layer being composed of at least Si and C, e.g., but not limited hereto, SiC, or at least Si, C and O, e.g. silicon oxycarbide, or at least Si, C and N, e.g. nitrided silicon carbide (SiNC) or at least Si, N, O and C, e.g. nitrided silicon oxycarbide (SiNOC), or at least Si, C and H e.g. amorphous hydrogenated silicon carbide (SiC: H), or at least Si, C, N and H, e.g. hydrogenated SiNC, or at least Si, 0, C, N and H, e.g. hydrogenated SiNOC. For the purpose of this disclosure, an oxide-silicon layer is a layer composed of at least Si and O, e.g. silicon (di) oxide, or of Si, O and a smaller fraction of C and/or a smaller fraction of N and/or a smaller fraction of H, for example silicon (di) oxide wherein the fraction of C and/or N and/or H smaller is than the fraction of O.

In an aspect of the invention, a method for removing at least partly an exposed part of a carbide-silicon layer formed on a substrate is disclosed comprising the steps of:

converting at least partly said exposed part of said carbide-silicon layer into an oxide-silicon layer by exposing said carbide-silicon layer to an oxygen containing plasma, removing said oxide-silicon layer from said substrate.

Said exposed part can be, but is not limited hereto, an exposed part in an opening or can be at least an exposed part of a layer.

This method can be applied in-situ. The substrate can be, but is not limited hereto, a partly processed or a pristine wafer or slice of a semi-conductive material, like Si or Ga As or Ge, or an insulating material, e.g. a glass slice, or a conductive material. Said substrate can comprise a patterned conductive layer. Particularly, in case said substrate is a partly processed wafer or slice; at least a part of the active and/or passive devices can already be formed and/or at least a part of the structures interconnecting these devices can be formed.

For the purpose of this disclosure, plasma should be understood as a conventional plasma such as a reactive ion etch (RIE) plasma or a chemical vapour deposition (CVD) plasma, or a plasma afterglow. By exposing said carbide-silicon layer to an oxygen-containing plasma, energy is given to the oxygen containing species, such that carbide-silicon is at least partly converted into oxide-silicon. This energy can be e.g. thermal energy or kinetic energy, e.g. by the formation of ions.

In accordance with an exemplary embodiment of the present invention, a method as recited in the first aspect of this invention is disclosed, wherein said conversion step and said removal step are subsequently repeated for a number of times until said carbide-silicon layer is substantially removed.

In accordance with another exemplary embodiment of the present invention, the conversion from a part of the carbide-silicon layer to an oxide-silicon layer can be performed by exposing the carbide-silicon layer to an oxygen-containing reactive ion etch (RIE) plasma. Particularly, the substrate including the carbide-silicon layer can be introduced in a pressurized chamber of a plasma-etch tool. The pressure can be lower than 3 Torr and preferably between 1 mTorr and 1 Torr. The temperature in said chamber can be 300° C. or below; or preferably below 100° C. This temperature can also be in the range from −20° C. to 100° C. Preferably, said temperature is about room temperature. The energy of the RIE plasma can be between 1 eV and 500 eV, such that ionic species can be formed.

In accordance with another exemplary embodiment, the conversion from a part of the carbide-silicon layer to an oxide-silicon layer can be performed by exposing the carbide-silicon layer to an oxygen-containing CVD plasma. The substrate including the carbide-silicon layer can be introduced in a pressurized chamber of a chemical vapor deposition tool. The pressure can be, but is not limited hereto, higher than 5 Torr, e.g. 10 Torr. The temperature can be in the range between 250° C. and 550° C., preferably in the range between 350° C. and 500° C.

In accordance with yet another exemplary embodiment of the invention, the conversion from a part of the carbide-silicon layer to an oxide-silicon layer can be performed by exposing the carbide-silicon layer to an oxygen-containing plasma afterglow. Particularly, the substrate including the carbide-silicon layer can be introduced in a pressurized chamber of a plasma tool. Said plasma afterglow can be characterized, but is not limited hereto, by a pressure in the range from 0.02 Torr to 3 Torr, and in the range between 0.2 Torr and 1.5 Torr and preferably between 0.75 Torr and 1.25 Torr, e.g. about 0.85 Torr or about 1.1 Torr. The flow of the oxygen containing substance can be lower than 10000 Sccm and preferably, but not limited hereto, about 4000 Sccm.

The temperature in said chamber is preferably 600° C. or below. This temperature can also be in the range from 100° C. to 600° C. and also in the range from 200° C. to 400° C. and also in the range from 200° C. to 300° C. This temperature is preferably, but not limited hereto, about 230° C.

In another aspect of the invention, an integrated circuit on a substrate with at least one conductive layer being partly exposed is disclosed, said circuit comprising:

a conductive layer deposited on a semiconducting layer, at least one dielectric layer having at least one opening extending through said dielectric layer to expose at least a part of said conductive layer, a carbide-silicon layer being formed at least on said conductive layer and being positioned between said dielectric layer and said conductive layer adjacent to said exposed part of said conductive layer.

Said conductive layer can be a pure metal or a metal alloy of the group of metals consisting of Al, Cu, W, Pt, Ag, Ni, Au, Co, Ti, Ta; or a Si-containing or other semiconductor-containing layer such as, but not limited hereto, e.g. a silicide, a polysilicon or a silicon layer. Said semiconducting layer can be a silicon containing layer, a GaAs layer, a Ge layer or a SiGe layer. Said dielectric layer has preferably a dielectric constant of less than about 4.

In accordance with an exemplary embodiment the invention an integrated circuit comprising an interconnect structure on a substrate having a surface with at least one exposed Si-containing layer, particularly a PMD structure, is disclosed. This interconnect structure further comprises:

a conformal silicide layer on said exposed Si-containing layer;

at least one dielectric layer on said surface of said substrate having at least one opening, said opening extending through said dielectric layer to thereby define an exposed part of said silicide layer; and a carbide-silicon layer being formed at least on said silicide layer and being positioned between said dielectric layer and said silicide layer adjacent to said exposed part of said silicide layer.

A silicide layer can be a compound comprising silicon and at least one of the group comprising Co, Ti, Ta, Co, Mb, Ni, Pt and W.

In yet a further aspect of the invention, a method for fabricating an integrated circuit on a substrate having a surface with at least one conductive layer on a semiconducting layer is disclosed. This conductive layer can be a pure metal or a metal alloy of the group of metals consisting of Al, Cu, W, Pt, Ag, Ni, Au, Co, Ti, Ta; or a Si-containing or other semiconductor-containing layer such as, but not limited hereto, e.g. a silicide, a polysilicon or a silicon layer.

This method comprises the steps of:

forming a carbide-silicon layer at least on said conductive layer;

depositing at least one dielectric layer on said surface and on said carbide-silicon layer;

forming at least one opening in said dielectric layer extending through said dielectric layer to thereby expose a part of said carbide-silicon layer formed on said conductive layer;

in-situ converting said exposed part of said carbide-silicon layer in said opening into a oxide-silicon layer by exposing said exposed part of said carbide-silicon layer in said opening to an oxygen-containing plasma; and removing said oxide-silicon layer in said opening.

Said conversion step and said removal step can subsequently be repeated for a number of times until at least a part of said conductive layer is exposed.

BRIEF DESCRIPTION OF THE DRAWINGS

The novel features believed characteristic of the present invention are set forth in the appended claims. The invention itself, however, as well as a preferred mode of use, further objectives and advantages thereof, will be best understood by reference to the following detailed description of an illustrative embodiment when read in conjunction with the accompanying drawings wherein:

Figure 1:
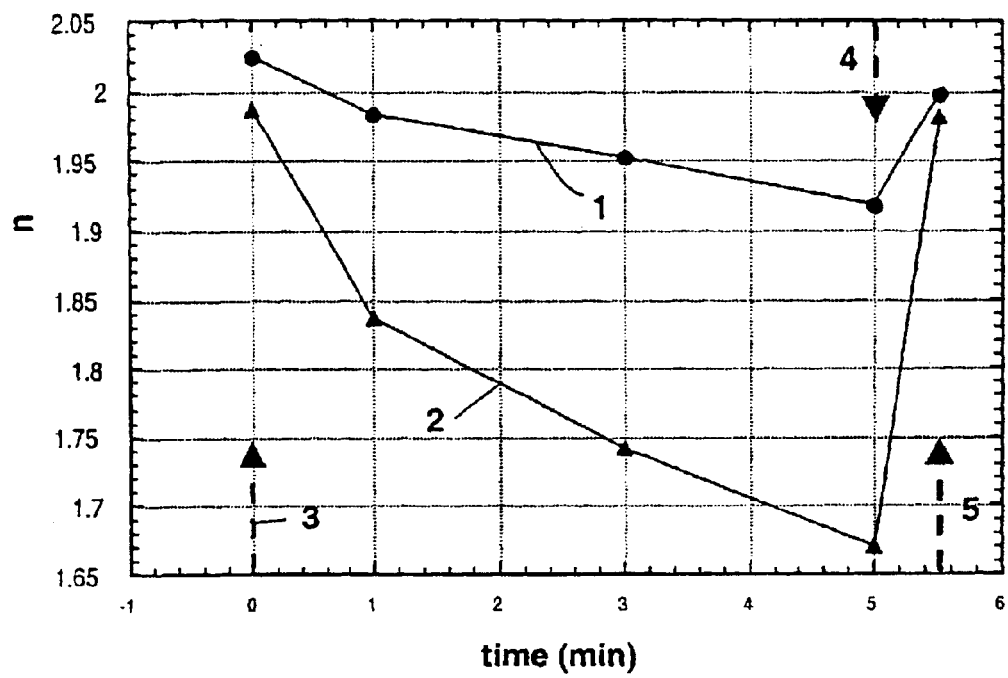
FIG. 1 depicts ellipsometric measurements performed on two different amorphous hydrogenated silicon carbide layers being a layer of 20 nm (2) and a layer of 50 nm (1) at different time periods being before (partly) conversion to a oxide-silicon layer (3) according to an exemplary embodiment of the present invention, from the onset of this conversion (3) till the removal of the converted part (4), and after the removal of the oxide-silicon layer (5)

Other features of the present invention will be apparent from the accompanying drawings and from the following detailed description.

DETAILED DESCRIPTION OF THE INVENTION

In relation to the appended drawings the present invention is described in details in the sequel. It is apparent however that a person skilled in the art can imagine several other equivalent embodiments or other ways of executing the present invention, the spirit and scope of the present invention being limited only by the terms of the appended claims.

At least for the purpose of this disclosure a carbide-silicon layer is an insulating layer being composed of at least Si and C, e.g., but not limited hereto, SiC, or at least Si, C and O, e.g. silicon oxycarbide, or at least Si, C and N, e.g. nitrided silicon carbide (SiNC) or at least Si, N, O and C, e.g. nitrided silicon oxycarbide (SiNOC), or at least Si, C and H e.g. amorphous hydrogenated silicon carbide (SiC: H), or at least Si, C, N and H, e.g. hydrogenated SiNC, or at least Si, O, C, N and H, e.g. hydrogenated SiNOC. For the purpose of this disclosure, an oxide-silicon layer is a layer composed of at least Si and O, e.g. silicon (di) oxide, or of Si, O and a smaller fraction of C and/or a smaller fraction of N and/or a smaller fraction of H, for example silicon (di) oxide wherein the fraction of C and/or N and/or H smaller is than the fraction of O. Said oxide-silicon layer comprises at least one of the group consisting of silicon dioxide, silicon dioxide with a smaller fraction of C, silicon dioxide with a smaller fraction of N and C, silicon dioxide with a smaller fraction of N, hydrogenated silicon dioxide, hydrogenated silicon dioxide with a smaller fraction of C, hydrogenated silicon dioxide with a smaller fraction of N and C and hydrogenated silicon dioxide with a smaller fraction of N.

In accordance with an exemplary embodiment of the present invention, an object is to remove an exposed part of a carbide-silicon layer in-situ by converting at least partly said exposed part of said carbide-silicon layer into an oxide-silicon. The disclosed method comprises the steps converting at least partly said exposed part of said carbide-silicon layer into an oxide-silicon layer by exposing said carbide-silicon layer to an oxygen containing plasma and removing said oxide-silicon layer from said substrate. Said conversion step and said removal step can be subsequently repeated for a number of times until said carbide-silicon layer is substantially removed.

Said exposed part can be, but is not limited hereto, an exposed part in an opening or can be at least an exposed part of a layer.

This method can be applied in-situ. The substrate can be, but is not limited hereto, a partly processed or a pristine wafer or slice of a semi-conductive material, like Si or Ga As or Ge, or an insulating material, e.g. a glass slice, or a conductive material. Said substrate can comprise a patterned conductive layer. Particularly, in case said substrate is a partly processed wafer or slice; at least a part of the active and/or passive devices can already be formed and/or at least a part of the structures interconnecting these devices can be formed.

Preferably this conversion is performed at low temperatures, preferably 600° C. or below, in an oxygen-containing plasma.

For the purpose of this disclosure, plasma should be understood as a conventional plasma such as a reactive ion etch (RIE) plasma or a chemical vapour deposition (CVD) plasma, or a plasma afterglow. By exposing said carbide-silicon layer to an oxygen-containing plasma, energy is given to the oxygen containing species, such that carbide-silicon is at least partly converted into oxide-silicon. This energy can be e.g. thermal energy or kinetic energy, e.g. by the formation of ions.

In accordance with an exemplary embodiment of the present invention the conversion from a part of the carbide-silicon layer to an oxide-silicon layer can be performed by exposing the carbide-silicon layer to an oxygen-containing reactive ion etch (RIE) plasma. Particularly, the substrate including the carbide-silicon layer can be introduced in a pressurized chamber of a plasma-etch tool. The pressure can be lower than 3 Torr and preferably between 1 mTorr and 1 Torr. The temperature in said chamber can be 300° C. or below; or preferably below 100° C. This temperature can also be in the range from −20° C. to 100° C. Preferably, said temperature is about room temperature. The energy of the RIE plasma can be between 1 eV and 500 eV, such that ionic species can be formed.

In accordance with another exemplary embodiment, the conversion from a part of the carbide-silicon layer to an oxide-silicon layer can be performed by exposing the carbide-silicon layer to an oxygen-containing CVD plasma. The substrate including the carbide-silicon layer can be introduced in a pressurised chamber of a chemical vapour deposition tool. The pressure can be, but is not limited hereto, higher than 5 Torr, e.g. 10 Torr. The temperature can be in the range between 250° C. and 550° C., preferably in the range between 350° C. and 500° C.

In accordance with yet another exemplary embodiment of the present invention, the conversion from a part of the carbide-silicon layer to an oxide-silicon layer can be performed by exposing the carbide-silicon layer to an oxygen-containing plasma afterglow. Particularly, the substrate including the carbide-silicon layer can be introduced in a pressurized chamber of a plasma-etch tool. Said plasma afterglow can be characterized, but is not limited hereto, by a pressure in the range from 0.02 Torr to 3 Torr, and in the range between 0.2 Torr and 1.5 Torr and preferably between 0.75 Torr and 1.25 Torr, e.g. about 0.85 Torr or 1.1 Torr. The flow of the oxygen containing substance can be lower than 10000 Sccm and preferably, but not limited hereto, about 4000 Sccm.

The temperature in said chamber is preferably 600° C. or below. This temperature can also be in the range from 100° C. to 600° C. and also in the range from 200° C. to 400° C. and also in the range from 200° C. to 300° C. This temperature is preferably, but not limited hereto, about 230° C.

Said removal step is performed by exposing the oxide silicon layer to a wet or dry etch. Said wet etch can comprise, but is not limited hereto, diluted HF, diluted BHF or wet etchants comprising HF or BHF. Said dry etch can be a dry etch chemistry comprising a fluorine source.

In accordance with an exemplary embodiment of the present invention, this conversion is performed at low temperatures, preferably 600° C. or below, in an oxygen-containing plasma, particularly in a plasma afterglow. The carbide-silicon layer is exposed to an oxygen-containing plasma afterglow at a temperature of 600° C. or below. Particularly a temperature in the range from 200° C. to 400° C. can be used. In this temperature range, conversion of the exposed part of a carbide-silicon layer can be obtained through interaction of atomic oxygen or an oxygen radical or an ionic oxygen or another oxygen containing oxidizing species with the carbide-silicon layer. Generation of these reactive species can be obtained by generating a plasma in appropriate gas mixtures. As an example, the oxidation of a carbide-silicon layer, particularly amorphous hydrogenated silicon carbide, obtained in the afterglow of an $O_2$-discharge is discussed below. The example is referred to as Example 1 (see also FIG. 1 and FIG. 2). An oxygen containing plasma is a plasma comprising at least oxygen. An oxygen containing plasma can comprise, but is not limited hereto, at least oxygen and one of the group consisting of $N_2$, $C_XF_Y$, $SF_Z$, or another halogen source.

EXAMPLE 1

Afterglow Oxidation of Amorphous Hydrogenated Silicon Carbide

The carbide-silicon layers (1) (2) were formed through plasma enhanced deposition on Si wafers. Thereafter, the carbide-silicon layers (1) (2) on these wafers are submitted to an $O_2/N_2$ plasma afterglow for different times at a pressure of 1.1 Torr. The $O_2$-flow is 4000 sccm, while the $N_2$-flow is 200 sccm. The wafer temperature was maintained at about 230° C. Different samples were submitted for different process times, all in the range from 2 to 8 minutes. After oxidation, samples were etched in a 2% HF mixture for 5 minutes (4). Ellipsometric measurements were performed after deposition of the film (3), after oxidation and after wet etching (5) in the diluted HF solution.

Figure 2:
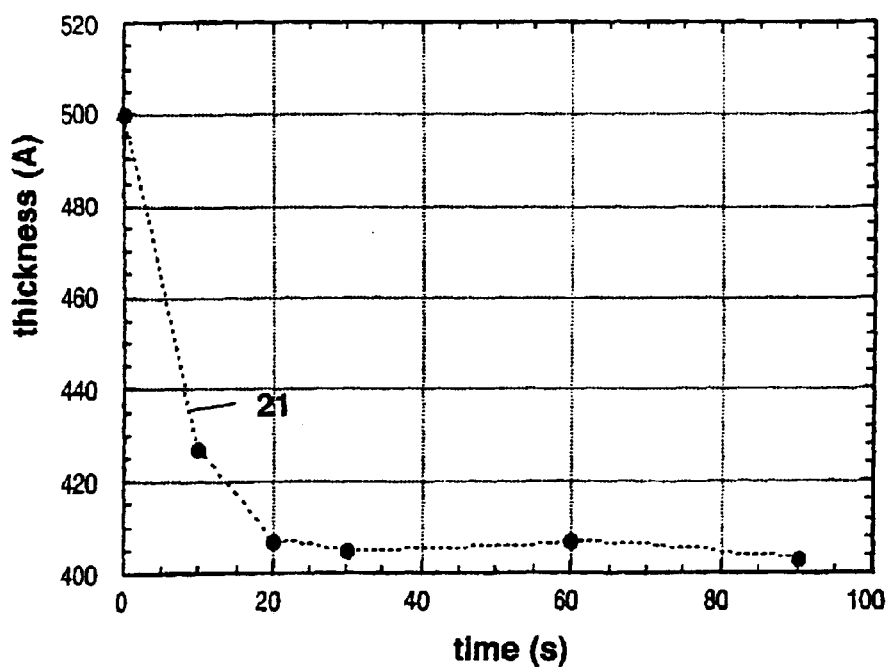
FIG. 2 depicts the thickness of a carbide-silicon layer which is partly converted into an oxide-silicon, according to an exemplary embodiment of the present invention, versus the etch time using a HF based etch solution.

From these measurements, the following observations can be made:

a. Exposure of carbide-silicon to an oxygen-containing ambient in the medium temperature range, i.e. the range from 100° C. to 600° C., converts the carbide silicon to a material showing different optical properties
b. The change of the ellipsometric parameters depends on the exposure time.
c. The converted material can be removed in 2% HF solution
d. The amount of removed material, i.e. the thickness of the converted layer, is depending on the exposure time. More material is removed for longer plasma exposure times.
e. After removal of the converted layer, identical optical properties as for the pristine carbide-silicon are found.
f. Carbide-silicon remains substantially unaffected when subjected to a 2% HF solution (FIG. 2). FIG. 2 (21) clearly shows that the converted part of the carbide silicon layer is removed in the first twenty seconds, while the etch process has no effect on the unconverted part of the carbide-silicon layer.

This example clearly shows the possibility of converting carbide-silicon layers to oxide-silicon layers. Dependent on the exposure times, the exposed layer of a carbide-silicon layer can be converted partly or completely. This converted layer can be removed e.g. in a HF based solution. The conversion step and the removal step are subsequently repeated for a number of times until said carbide-silicon layer is substantially removed. In case the conversion is complete, after etching the layer underlying the original carbide-silicon layer is exposed. In the latter case the removal process is selected such that it selectively removes the oxide-silicon layer at least with respect to said underlying layer.

In accordance with another exemplary embodiment of the present invention, at least a part of a carbide-silicon layer is exposed to an oxygen-containing RIE plasma. Using an RIE plasma instead of a plasma afterglow can have some benefits including the possibility to perform the conversion at low temperatures, e.g. at room temperature. Moreover, besides the potential benefit of the lower temperature, the conversion can be performed anisotropically in an RIE plasma which is a huge benefit for in-situ conversion especially for fabricating interconnect and dielectric structures such as e.g. a damascene or dual-damascene metallization scheme.

Alternatively, instead of exposing carbide-silicon to an oxygen-containing plasma, one can also expose carbide-silicon to a nitrogen-containing plasma in order to convert the carbide-silicon to a nitride-silicon. At least for the purpose of this disclosure a nitride-silicon layer is a layer composed of at least Si and N, e.g. silicon nitride or of Si, N and a smaller fraction of C. In case of this nitridation, the converted carbide-silicon layer can be removed using e.g. Phosphoric acid. By doing so, the obtained $Si_3N_4$ can be removed selective both to silicon (di) oxide and silicon. This method can for instance be used in integration schemes where the carbide-silicon layers needs to be removed selective to silicon (di) oxide present on the wafer surface.

In accordance with yet another exemplary embodiment of the present invention, an integrated circuit is disclosed wherein a carbide-silicon layer is used as an etch stop layer and as a diffusion barrier layer between a conductive layer and the surrounding dielectric. The conductive layer can be deposited on a semiconducting layer. The conductive layer (43) can be a pure metal or a metal alloy of the group of metals consisting of Al, Cu, W, Pt, Ag, Ni, Au, Co, Ti, Ta, or a Si-containing or other semiconductor-containing layer such as e.g. a silicide, a polysilicon or a silicon layer. This conductive layer can also be a stack of a barrier layer, conductive or not, and a metal layer.

In accordance with an exemplary embodiment of the present invention, an interconnect structure on a substrate having a surface with at least one exposed Si-containing layer, particularly a PMD structure, is disclosed wherein a carbide-silicon layer is used as an etch stop layer nowadays which puts even some more emphasis on this selectivity:

a) Introduction of CMP inducing nonuniformity of the dielectric and hence requiring increased over-etch time.

b) Reduction of the silicide thickness requiring ever increasing selectivity.

c) Introduction of shallow junctions being more sensitive for degradation effects and putting stringent requirements on the maximum allowable silicide thickness.

All of these trends require better selectivity towards silicides and in fact, for some technologies, selectivity becomes the limiting factor.

A way to address the selectivity issue is the use of a so-called etch stop layer. Such a thin etch-stop layer is deposited at least on the silicide contact layers prior to the deposition of the pre-metal dielectric stack. A typical material being used as an etch stop layer is silicon nitride. The contact etch process is set up to stop on or in the this silicon nitride layer. Afterwards, an additional etch step for controlled removal of the thin nitride layer is introduced. Advantages of this approach are the limited exposure of the silicides and/or silicon or other substrate material to the etch plasma which, in principle allows better control of substrate material loss. The introduction of an etch stop layer can overcome the etch problems related to the topography of the dielectric layers to be etched and the effect of multi-level schemes, particularly the simultaneous definition of shallow and deep contact holes. The set up of the contact etch and nitride removal process however is complicated. Dependent on the dielectrics used, the selectivity of the etch process of the dielectric towards nitride can be too limited, especially when silicon (di) oxide is used as a dielectric. Moreover, the removal of nitride selective towards silicide is even a bigger problem.

Besides the selectivity issue the etch-stop layer also has to be a good barrier layer amongst others to reduce the in-diffusion of contamination e.g. metal particles. In case silicon nitride is used as etch stop layer, then this layer needs careful optimization towards better barrier properties and it can be expected that improvement in terms of in-diffusion of contamination will result in a more difficult etch and therefore negatively influences the selectivity issue.

Further according to this exemplary embodiment of the invention a carbide-silicon layer is introduced as an etch stop layer having excellent barrier properties. Due to its intrinsic high chemical stability it is almost impossible to remove it selectively towards silicide. However due to the conversion method of the present convention it can be converted in-situ at sufficient low temperature in an oxide-silicon, which on its turn can be easily removed selectively towards the silicide. For a typical oxide etch process (e.g. $CF_4/CHF_3$), the selectivity of oxide etch towards SiC is better than the selectivity towards nitride. For less standard chemistries, the same behavior has been demonstrated. In addition, the selectivity of oxide etch towards silicide is better than the selectivity of nitride etch towards silicide.

Figure 3:
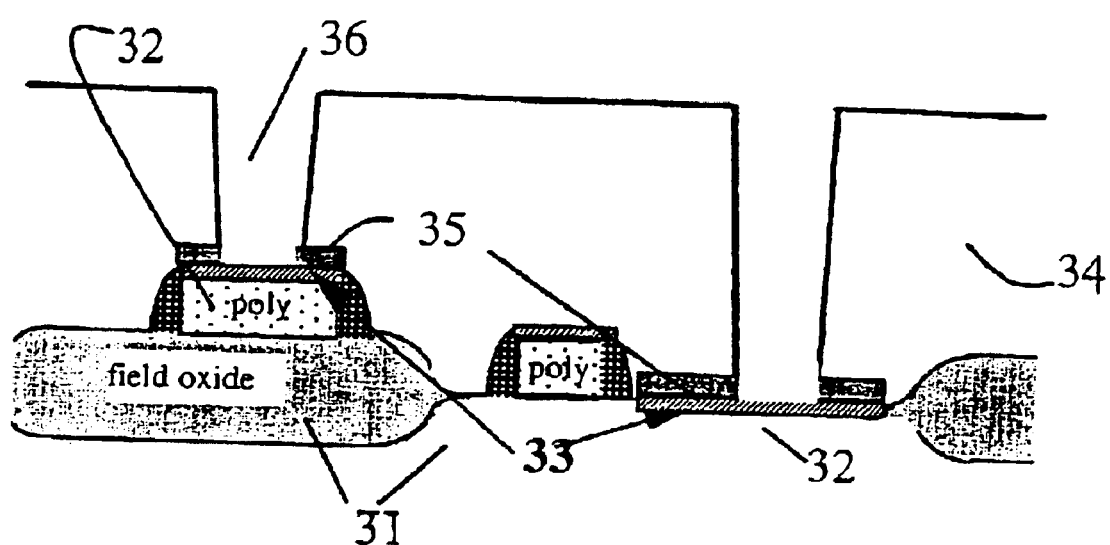
FIG. 3 depicts a schematic representation of a pre-metal dielectric structure according to an exemplary embodiment of the present invention.

In FIG. 3 an interconnect structure on a substrate (31) having a surface with at least one exposed Si-containing layer (32), particularly a PMD structure, is disclosed. An exposed Si-containing layer can be a Si-containing substrate layer (32), such as e.g. a source, a drain or a collector region, or a polysilicon or amorphous silicon region, such as e.g. a gate region or an extrinsic emitter or base region. The substrate can be a partly processed or a pristine wafer or slice of a semiconductive material, like Si or GaAs or Ge, or an insulating material, e.g. a glass slice. Said substrate can comprise a patterned dielectric layer and/or a patterned amorphous silicon or polysilicon layer. Particularly, in case said substrate is a partly processed wafer or slice; at least a part of the active and/or passive devices can already be formed.

This PMD structure further comprises:
a silicide layer (33) on said exposed Si-containing layer;
at least one dielectric layer (34) on said surface of said substrate having at least one opening (36), said opening extending through said dielectric layer to thereby define an exposed part of said silicide layer; and
a carbide-silicon layer (35) being formed at least on said silicide layer and being positioned between said dielectric layer and said silicide layer adjacent to said exposed part of said silicide layer.

A dielectric layer can be a ceramic silicon oxide, nitride or oxynitride layer, fluorinated or not, or an organic polymer layer selected from the group consisting of the benzocyclobutarenes, i.e. benzocyclobutene (BCB) commercially available as Cyclotene 5021™, poly arylene ether, i.e. FLARE II, aromatic hydrocarbon, i.e. SILK™, and polyimides. Such an organic polymer layer can be in-situ fluorinated. Also porous (inorganic) dielectric layers can be used as for instance e.g. the xerogels.

Typical examples of suicides are silicides of a refractory metal such as Ti, Ta, Co, Mb, Ni and Pt.

Figure 4:
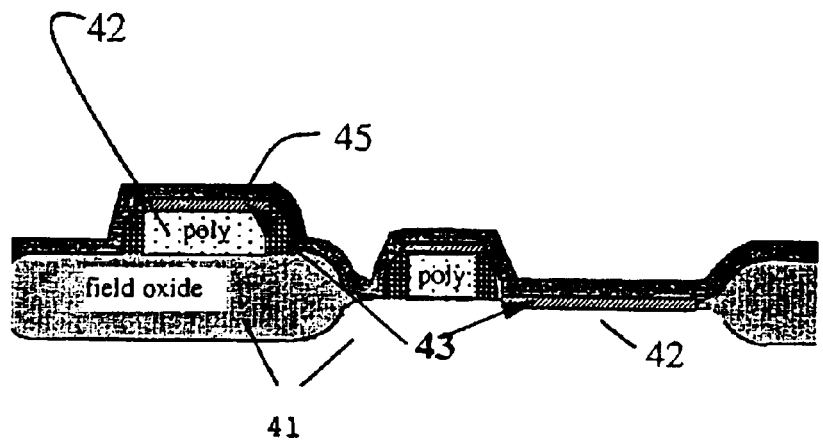
FIG. 4 depicts some processing steps applied to obtain a pre-metal dielectric structure according to an exemplary embodiment of the present invention.
Figure 4:
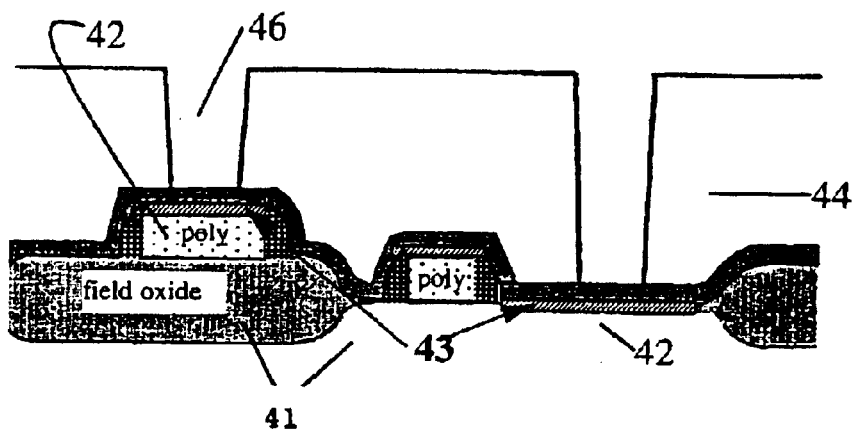
Figure 4:
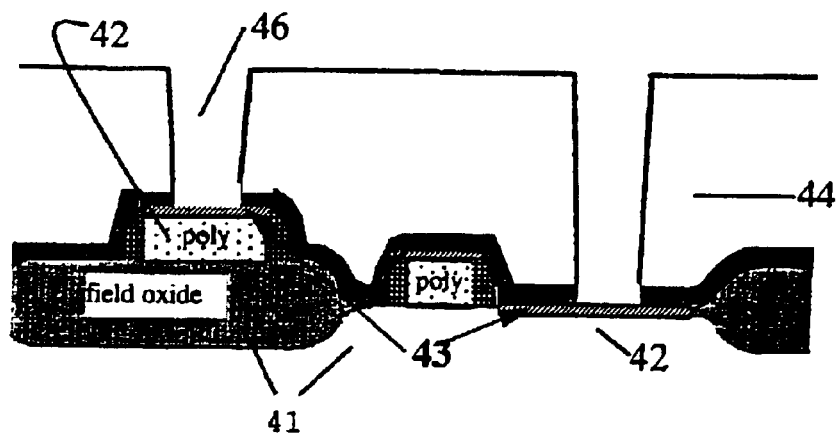

In FIG. 4, according to a further exemplary embodiment of the present invention, some of the process steps to obtain an interconnect structure, including a PMD structure and inter or intra metal structures (IMD), are depicted:

a) As a first process step (step a)), a carbide-silicon layer (45) with a thickness of typically about 50 nm is deposited on a substrate (41), i.e. at least on the exposed conductive layers (42). Preferably however, a blanket deposition of this insulating carbide-silicon layer is performed. This carbide-silicon layer which is at the same time an etch-stop layer and a barrier layer prevents the in-diffusion of contamination. The conductive layer (43) can be a pure metal or a metal alloy of the group of metals consisting of Al, Cu, W, Pt, Ag, Ni, Au, Co, Ti, Ta, or a Si-containing or other semiconductor-containing layer such as e.g. a silicide, a polysilicon or a silicon layer. This conductive layer can also be a stack of a barrier layer, conductive or not, and a metal layer. The substrate can be a partly processed or a pristine wafer or slice of a semi-conductive material, like Si or Ga As or Ge, or SiGe or an insulating material, e.g. a glass slice, or a conductive material. Said substrate comprises a (patterned) conductive layer. Particularly, in case said substrate is a partly processed wafer or slice; at least a part of the active and/or passive devices can already be formed and/or at least a part of the structures interconnecting these devices can be formed;

b) After the deposition of the carbide-silicon layer, at least one dielectric layer (44) is formed thereon. Then, at least one opening is formed (step b)) in the dielectric layer(s) extending through the dielectric layer(s) to thereby expose a part of the carbide-silicon layer formed on the conductive layer. This opening is formed preferably using a dry etch sequence using at least a patterned resist layer on top the dielectric layers as a mask. Because the carbide-silicon acts as an etch-stop layer, there is a large process window available for this contact etch process;

c) The exposed part of the carbide-silicon layer in the opening can now be at least partly converted in-situ into oxide-silicon by exposure to an oxygen-containing plasma; and d) Thereafter, the oxide-silicon layer in said opening (and simultaneously the resist) can be removed selectively. The sequence of steps c) and d) can be executed repeatedly till the underlying conductive layer is exposed.

There are several alternatives possible for this sequence of steps a) to d). The invention is in no way restricted to this particular sequence.

As a first alternative one can opt for a complete conversion of the carbide-silicon (step c)). In this case, the oxide-silicon layer can be removed selectively to said conductive layer to thereby expose a part of said conductive layer.

As a further alternative, prior to the conversion of the carbide-silicon (step c)), a barrier layer can be formed at least on the side walls of the openings in the dielectric layers (s) to protect the dielectric stack. In case the subsequent conversion/removal of the carbide silicon is executed by means of exposure in an anisotropic oxygen-containing RIE, plasma, then one can also opt for a carbide-silicon layer as barrier layer on the side walls of the openings.

EXAMPLE 2

An Exemplary Processing Scheme Further According to the Method of the Present Invention First a SiC layer is deposited on a Si-wafer comprising patterned oxide layers and exposed conductive layers of $TiSi_2$ directly on the Si wafer and of $TiSi_2$ on patterned polysilicon layers. Then oxide layers are deposited defining a dielectric stack. A resist is formed and patterned atop this dielectric stack. Next the Si-wafer is introduced in an oxide etch chamber for the contact etch defining the openings in the oxide stack. The etch stops on the SiC layer. The exposed part of the SiC layer is in-situ converted into silicon dioxide using a low temperature oxygen-containing plasma afterglow, while at the same time the resist is removed. The same oxide etch chamber is used. Finally, the converted SiC, i.e. the silicon dioxide is removed selectively towards the $TiSi_2$ in the same oxide etch chamber. Some advantages of using SiC instead of e.g. silicon nitride include: full in-situ processing, reduced silicide loss, good contact resistance and yield since standard chemistry can be used, and improved barrier properties. SiC can be used in this processing scheme as alternative material towards nitride.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art. The embodiments were chosen and described in order to best explain the principles of the invention and the practical application, and to enable others of ordinary skill in the art to understand the invention for various embodiments with various modifications as are suited to the particular use contemplated.

What is claimed is:

1. An integrated circuit on a substrate having a surface with at least one conductive layer comprising:
    a conductive layer deposited on a semiconducting layer,
    at least one dielectric layer having at least one opening extending through said dielectric layer to expose at least a part of said conductive layer, and
    a carbide-silicon layer being formed at least on said conductive layer and being positioned between said dielectric layer and said conductive layer adjacent to said exposed part of said conductive layer.

2. The integrated circuit as recited in claim 1, wherein said conductive layer is a silicide layer.

3. The integrated circuit as recited in claim 2, wherein said silicide is a compound comprising silicon and at least one of the group consisting of Co, Ti, Ta, Co, Mb, Ni, Pt and W.

4. The integrated circuit as recited in claim 1, wherein said conductive layer is one of the group consisting of a polysilicon layer and an amorphous silicon layer.

5. The integrated circuit as recited in claim 1, wherein said semiconducting layer is one of the group consisting of a silicon layer, a Ga As layer, a Ge layer and a SiGe layer.

6. The integrated circuit as recited in claim 1, wherein said carbide-silicon layer comprises at least one of the group consisting of silicon carbide, silicon oxycarbide, nitrided silicon carbide, nitrided silicon oxycarbide, hydrogenated silicon carbide, hydrogenated silicon oxycarbide, hydrogenated nitrided silicon carbide and hydrogenated nitrided silicon oxycarbide.

7. The integrated circuit as recited in claim 1, further comprises:
    an oxide-silicon layer, said process oxide-silicon layer formed in the at least one opening extending through said deielectric layer from at least part of the carbide-silicon layer, and removed forming said at least one opening, wherein said process oxide-silicon layer comprises at least one of the group consisting of silicon dioxide, silicon dioxide with a smaller fraction of C, silicon dioxide with a smaller fraction of N and C, silicon dioxide with a smaller fraction of N, hydrogenated silicon dioxide, hydrogenated silicon dioxide with a smaller fraction of C, hydrogenated silicon dioxide with a smaller fraction of N and C and hydrogenated silicon dioxide with a smaller fraction of N.

8. The integrated circuit as recited in claim 2, wherein said semiconducting layer is one of the group consisting of a silicon layer, a Ga As layer, a Ge layer and a SiGe layer.

9. The integrated circuit as recited in claim 3, wherein said semiconducting layer is one of the group consisting of a silicon layer, a Ga As layer, a Ge layer and a SiGe layer.

10. The integrated circuit as recited in claim 4, wherein said semiconducting layer is one of the group consisting of a silicon layer, a Ga As layer, a Ge layer and a SiGe layer.

11. The integrated circuit as recited in claim 2, wherein said carbide-silicon layer comprises at least one of the group consisting of silicon carbide, silicon oxycarbide, nitrided silicon carbide, nitrided silicon oxycarbide, hydrogenated silicon carbide, hydrogenated silicon oxycarbide, hydrogenated nitrided silicon carbide and hydrogenated nitrided silicon oxycarbide.

12. The integrated circuit as recited in claim 3, wherein said carbide-silicon layer comprises at least one of the group consisting of silicon carbide, silicon oxycarbide, nitrided silicon carbide, nitrided silicon oxycarbide, hydrogenated silicon carbide, hydrogenated silicon oxycarbide, hydrogenated nitrided silicon carbide and hydrogenated nitrided silicon oxycarbide.

13. The integrated circuit as recited in claim 4, wherein said carbide-silicon layer comprises at least one of the group consisting of silicon carbide, silicon oxycarbide, nitrided silicon carbide, nitrided silicon oxycarbide, hydrogenated silicon carbide, hydrogenated silicon oxycarbide, hydrogenated nitrided silicon carbide and hydrogenated nitrided silicon oxycarbide.

14. The integrated circuit as recited in claim 5, wherein said carbide-silicon layer comprises at least one of the group consisting of silicon carbide, silicon oxycarbide, nitrided silicon carbide, nitrided silicon oxycarbide, hydrogenated silicon carbide, hydrogenated silicon oxycarbide, hydrogenated nitrided silicon carbide and hydrogenated nitrided silicon oxycarbide.

15. The integrated circuit as recited in claim 2, further comprises:

an oxide-silicon layer, said process oxide-silicon layer formed in the at least one opening extending through said dielectric layer from at least part of the carbide-silicon layer, and removed forming said at least one opening, wherein said oxide-silicon layer comprises at least one of the group consisting of silicon dioxide, silicon dioxide with a smaller fraction of C, silicon dioxide with a smaller fraction of N and C, silicon dioxide with a smaller fraction of N, hydrogenated silicon dioxide, hydrogenated silicon dioxide with a smaller fraction of C, hydrogenated silicon dioxide with a smaller fraction of N and C and hydrogenated silicon dioxide with a smaller fraction of N.

16. The integrated circuit as recited in claim 3, further comprises:

an oxide-silicon layer, said process oxide-silicon layer formed in the at least one opening extending through said dielectric layer from at least part of the carbide-silicon layer, and removed forming said at least one opening, wherein said oxide-silicon layer comprises at least one of the group consisting of silicon dioxide, silicon dioxide with a smaller fraction of C, silicon dioxide with a smaller fraction of N and C, silicon dioxide with a smaller fraction of N, hydrogenated silicon dioxide, hydrogenated silicon dioxide with a smaller fraction of C, hydrogenated silicon dioxide with a smaller fraction of N and C and hydrogenated silicon dioxide with a smaller fraction of N.

17. The integrated circuit as recited in claim 4 further comprises:

an oxide-silicon layer, said process oxide-silicon layer formed in the at least one opening extending through said dielectric layer from at least part of the carbide-silicon layer, and removed forming said at least one opening, wherein said oxide-silicon layer comprises at least one of the group consisting of silicon dioxide, silicon dioxide with a smaller fraction of C, silicon dioxide with a smaller fraction of N and C, silicon dioxide with a smaller fraction of N, hydrogenated silicon dioxide, hydrogenated silicon dioxide with a smaller fraction of C, hydrogenated silicon dioxide with a smaller fraction of N and C and hydrogenated silicon dioxide with a smaller fraction of N.

18. The integrated circuit as recited in claim 5 further comprises:

an oxide-silicon layer, said process oxide-silicon layer formed in the at least one opening extending through said dielectric layer from at least part of the carbide-silicon layer, and removed forming said at least one opening, wherein said oxide-silicon layer comprises at least one of the group consisting of silicon dioxide, silicon dioxide with a smaller fraction of C, silicon dioxide with a smaller fraction of N and C, silicon dioxide with a smaller fraction of N, hydrogenated silicon dioxide, hydrogenated silicon dioxide with a smaller fraction of C, hydrogenated silicon dioxide with a smaller fraction of N and C and hydrogenated silicon dioxide with a smaller fraction of N.

19. The integrated circuit as recited in claim 6 further comprises:

an oxide-silicon layer, said process oxide-silicon layer formed in the at least one opening extending through said dielectric layer from at least part of the carbide-silicon layer, and removed forming said at least one opening, wherein said oxide-silicon layer comprises at least one of the group consisting of silicon dioxide, silicon dioxide with a smaller fraction of C, silicon dioxide with a smaller fraction of N and C, silicon dioxide with a smaller fraction of N, hydrogenated silicon dioxide, hydrogenated silicon dioxide with a smaller fraction of C, hydrogenated silicon dioxide with a smaller fraction of N and C and hydrogenated silicon dioxide with a smaller fraction of N.

* * * * *